United States Patent
Tripathi et al.

(10) Patent No.: US 10,534,723 B1
(45) Date of Patent: Jan. 14, 2020

(54) SYSTEM, METHOD, AND COMPUTER PROGRAM PRODUCT FOR CONDITIONALLY ELIMINATING A MEMORY READ REQUEST

(71) Applicant: Mentor Graphics Corporation, Wilsonville, OR (US)

(72) Inventors: Nikhil Tripathi, Noida (IN); Venky Ramachandran, Cupertino, CA (US); Malay Haldar, Sunnyvale, CA (US); Sumit Roy, San Jose, CA (US); Anmol Mathur, San Jose, CA (US); Abhishek Roy, Noida (IN); Mohit Kumar, Noida (IN)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 15/632,234

(22) Filed: Jun. 23, 2017

Related U.S. Application Data (62) Division of application No. 12/772,051, filed on Apr. 30, 2010, now Pat. No. 9,720,859.

(51) Int. Cl.
  *G06F 12/00* (2006.01)
  *G06F 12/14* (2006.01)
  *G11C 7/10* (2006.01)

(52) U.S. Cl.
  CPC ............ *G06F 12/14* (2013.01); *G11C 7/1072* (2013.01); *G06F 2212/1052* (2013.01)

(58) Field of Classification Search
  CPC ............ G06F 12/14; G06F 2212/1052; G11C 7/1072
  See application file for complete search history.

(56) References Cited

U.S. PATENT DOCUMENTS

| | | |
|---|---|---|
| 5,848,025 A | 12/1998 | Marietta et al. |
| 6,247,134 B1 | 6/2001 | Sproch et al. |
| 6,389,514 B1 | 5/2002 | Rokicki |
| 6,430,634 B1 | 8/2002 | Mito |
| 6,601,167 B1 | 7/2003 | Gibson et al. |
| 6,636,927 B1 | 10/2003 | Peters et al. |
| 7,761,827 B1 | 7/2010 | Ramachandran et al. |
| 7,966,593 B1 | 6/2011 | Ramachandran et al. |
| 2002/0056027 A1 | 5/2002 | Kanai et al. |
| 2004/0111248 A1 | 6/2004 | Granny |
| 2004/0123042 A1 | 6/2004 | Shafi et al. |
| 2004/0123067 A1 | 6/2004 | Sprangle et al. |
| 2006/0047914 A1* | 3/2006 | Hofmann ............... G06F 9/383 711/137 |
| 2009/0157982 A1 | 6/2009 | Macinnis et al. |
| 2009/0172287 A1 | 7/2009 | LeMire et al. |

OTHER PUBLICATIONS

Alidina et al., "Precomputation-Based Sequential Logic Optimization for Lower Power," *IEEE Trans on VLSI Systems*, vol. 2, No. 4, Dec. 1994, pp. 426-436.

(Continued)

*Primary Examiner* — Gurtej Bansal
(74) *Attorney, Agent, or Firm* — Mentor Graphics Corporation (57) ABSTRACT

A system, method and computer program product are provided for conditionally eliminating a memory read request. In use, a memory read request is identified. Additionally, it is determined whether the memory read request is an unnecessary memory read request. Further, the memory read request is conditionally eliminated, based on the determination.

20 Claims, 8 Drawing Sheets

(56) References Cited

OTHER PUBLICATIONS

Babighian et al., "A Scalable Algorithm for RTL Insertion of Gated Clocks Based on ODCs Computation," *IEEE Trans on CAD of ICs & Systems*, vol. 24, No. 1, Jan. 2005, pp. 29-42.

Benini et al., "Automatic Synthesis of Low-Power Gated-Clock Finite-State Machines," IEEE *Trans. on CAD of ICs and Systems*, col. 15, No. 6, Jun. 1996, pp. 630-643.

Benini et al., "Saving Power by Synthesizing Gated Clocks for Sequential Circuits," *IEEE Design & Test of Computers*, Winter 1994, pp. 32-41.

Benini et al., "Symbolic Synthesis of Clock-Gating Logic for Power Optimization of Synchronous Controllers," *ACM*, 1999, pp. 351-375.

Farrahi et al., "Memory Segmentation to Exploit Sleep Mode Operation," *1995 32nd ACM/IEEE Design Automation Conference*, 6 pages.

Raghavan et al., "Automatic Insertion of Gates Clocks at Register Transfer Level," *1999 Proc. Twelfth Int'l Conference on VLSI Design*, pp. 48-54.

Roy et al., "Resynthesis of Sequential Circuits for Low Power," 1998 IEEE, pp. 57-61.

Téllez et al., "Activity-Driven Clock Design for Low Power Circuits," *1995 IEEE*, pp. 62-65.

Wu et al., "Clock-Gating and Its Application to Low Power Design of Sequential Circuits," *IEEE Trans on Circuits and Systems—I: Fundamental Theory and Applications*, vol. 47, No. 103, Mar. 2000, pp. 415-420.

\* cited by examiner

SYSTEM, METHOD, AND COMPUTER PROGRAM PRODUCT FOR CONDITIONALLY ELIMINATING A MEMORY READ REQUEST

CROSS REFERENCE TO RELATED APPLICATONS

This is a Divisional of U.S. patent application Ser. No. 12/772,051, filed Apr. 30, 2010, which is hereby incorporated by reference.

FIELD OF THE INVENTION

The present invention relates to power optimization, and more particularly to logic optimization regarding memory reads.

BACKGROUND

Memory read requests contribute significantly to the power consumption of many devices, for example, system-on-chip (SoC) devices, etc. In another example, these memory read requests are the source of much, if not all, of the steady-state dynamic power consumption associated with embedded memories. However, traditional techniques for managing memory read requests have generally exhibited various limitations.

For example, under many circumstances memory read requests may not be optimized. Such memory read requests may prove to be redundant, may have results that are not utilized, or may otherwise prove unnecessary. There is thus a need for addressing these and/or other issues associated with the prior art.

SUMMARY

A system, method and computer program product are provided for conditionally eliminating a memory read request. In use, a memory read request is identified. Additionally, it is determined whether the memory read request is an unnecessary memory read request. Further, the memory read request is conditionally eliminated, based on the determination.

DETAILED DESCRIPTION

Figure 1:
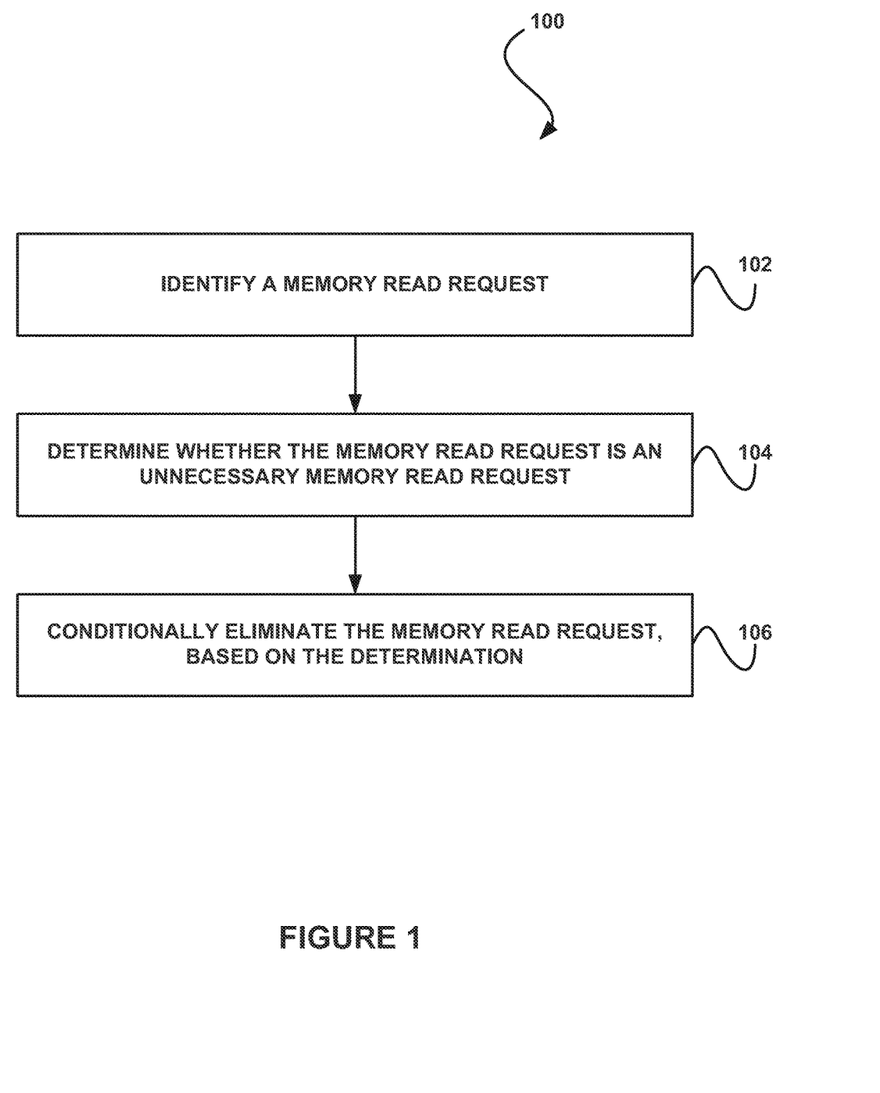
FIG. 1 shows a method for conditionally eliminating a memory read request, in accordance with one embodiment.

FIG. 1 shows a method 100 for conditionally eliminating a memory read request, in accordance with one embodiment. As shown in operation 102, a memory read request is identified. In the context of the present description, the memory read request may include any request to read one or more portions of data from the memory. In one embodiment, the memory read request may include a read address. In another embodiment, the memory read request may include a read enable for a port of the memory. For example, the read enable may include one or more conditions where one or more pins of a memory are set to particular values.

Additionally, the memory may include any type of physical memory. For example, the memory may include an embedded memory. In another embodiment, the memory may include a static random-access memory (SRAM) based memory. Additionally, in yet another embodiment, the memory may include a single port memory. In still another embodiment, the memory may include a multi-port memory, such as a one read one write memory, a two port memory, etc. In another embodiment, the memory may include one or more of a dedicated port for read access and a dedicated port for write access. Further, the memory may have any latency. For example, the memory may have a latency of one cycle, more than one cycle, etc.

Additionally, in one embodiment, the memory read request may be identified by intercepting the memory read request. For example, the memory read request may be received before the memory read request reached the memory, is performed at the memory, etc. Of course, however, the memory read request may be identified in any manner.

As also shown, it is determined whether the memory read request is an unnecessary memory read request. Note operation 104. In one embodiment, the memory read request may be determined to be an unnecessary memory read request if one or more results of the memory read request are not utilized within a predetermined period. For example, the memory read request may be determined to be an unnecessary memory read request if an output of the memory in response to the memory read request remains unobservable from a clock cycle following the memory read request to a clock cycle of a subsequent memory read request.

In another embodiment, the memory read request may be determined to be an unnecessary memory read request if it is determined that one or more results of a previous memory read request may be reused instead of the results of the identified memory read request. For example, the memory read request may be determined to be an unnecessary memory read request if a read address of the memory read request is the same as another read address of a previous memory read request, and no write to the read address has occurred since the previous memory read request. For instance, the read address of the previous memory read request may be logged or otherwise stored (e.g., as a current or previous state of the memory, etc.) and may be compared to the read address of the memory read request.

In another example, the memory read request may be determined to be an unnecessary memory read request if no write request is detected to any address in between two successive memory read requests to the same address, where the memory read request is one of the two successive memory read requests. For example, an instance of stability may be associated with the memory read request, and such instance of stability may be cleared once the write request is detected to any address in between two successive memory read requests to the same address.

Further, as shown in operation 106, the memory read request is conditionally eliminated, based on the determination. In one embodiment, the memory read request may be eliminated if the memory read request is determined to be an unnecessary memory read request. In another embodiment, the memory read request may be eliminated by adding a condition that prevents the memory read request. Of course, however, the memory read request may be eliminated in any manner.

In one exemplary embodiment, determining whether the memory read request is the unnecessary memory read request may include extracting a condition of an output of the memory. Additionally, the extracted condition may be accelerated. In still another embodiment, the condition may include a part of an unobservability condition of the memory output that satisfies a safety property. Further, conditionally eliminating the memory read request may include combining the accelerated condition with a memory enable of the memory. In this way, the memory read request may be executed at the memory only when the accelerated condition is met.

Further still, in yet another exemplary embodiment, determining whether the memory read request is the unnecessary memory read request may include determining whether a constant condition for a read address of the memory exists. Additionally, a constant-based stability condition may be determined if the constant condition for the read address of the memory exists. Further, conditionally eliminating the memory read request may include combining the constant-based stability condition with a memory enable of the memory. In this way, the memory read request may be executed at the memory only when the constant-based stability condition is met.

Also, in still another exemplary embodiment, determining whether the memory read request is the unnecessary memory read request may include determining whether a condition exists where a read address of the memory has not changed from a previous cycle value. Further, a pure-stability-based stability condition may be determined if the condition exists where the read address of the memory has not changed from the previous cycle value. Further still, conditionally eliminating the memory read request may include combining the pure-stability-based stability condition with a memory enable of the memory. In this way, the memory read request may be executed at the memory only when the pure-stability-based stability condition is met. Further, read requests that prove to be redundant, have results that are not utilized, or may otherwise prove unnecessary may be avoided.

Figure 2:
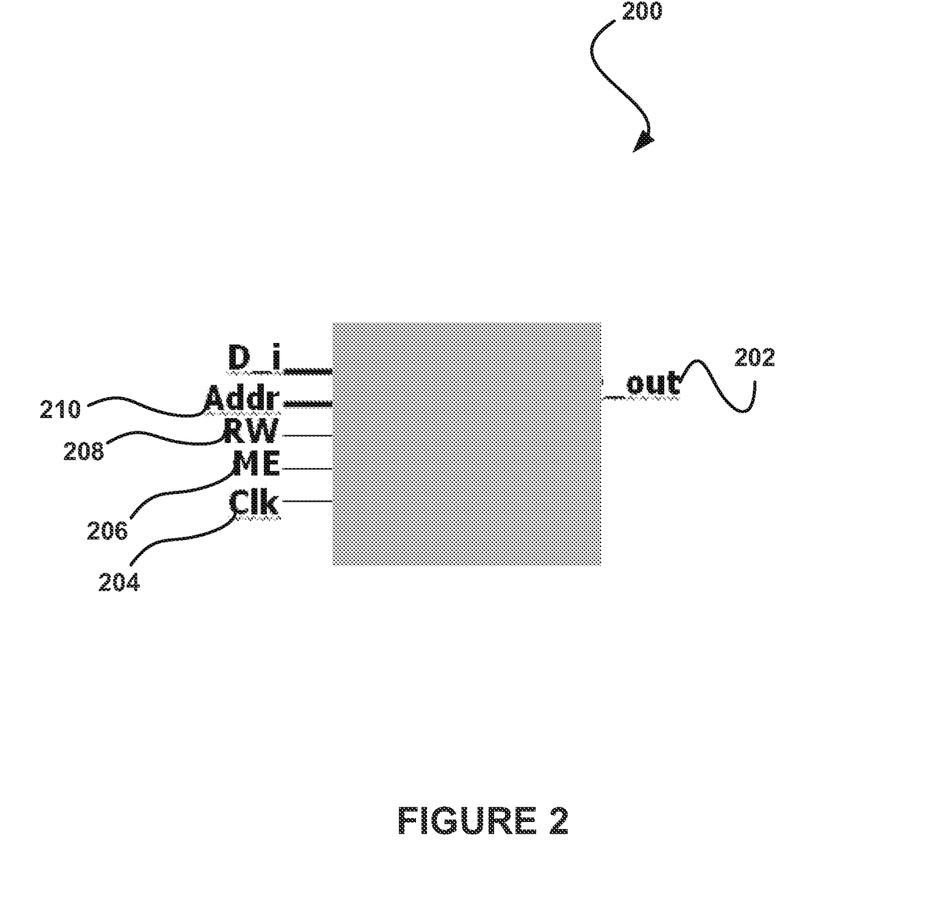
FIG. 2 shows an exemplary SRAM memory, in accordance with another embodiment.

FIG. 2 shows an exemplary SRAM memory 200, in accordance with one embodiment. As an option, the memory 200 may be utilized in the context of the details of FIG. 1. Of course, however, the memory 200 may be utilized in any desired environment. Further, the aforementioned definitions may equally apply to the description below.

As shown, the memory 200 includes an output 202, a clock input 204, a memory enable input 206, a read/write input 208, and an address input 210. In one embodiment, a read request may be asserted for the memory 200 by setting up the read address to a legitimate value at the address input 210. Additionally, the read request may be asserted for the memory 200 by setting the memory enable input 206 to a value of one (1) and by setting the read/write input 208 to zero (0). For example, the read enable of the memory 200 may be shown as the condition: ME=1 and RW=0, or alternatively: (ME & !RW).

In another embodiment, the memory 200 may respond to a read request (e.g., where the aforementioned read address and enables are asserted appropriately, etc.) with a latency of one cycle. In another embodiment, the memory 200 may take more than one cycle for the read output 202 to be ready for consumption. In one embodiment, read results may be held on the memory output 202 for the subsequent period until one cycle after a next read request is presented to the memory 200. In another embodiment, a write request may also cause the relevant memory output 202 to be overwritten with a one cycle delay. This may be referred to as write-through.

Figure 3:
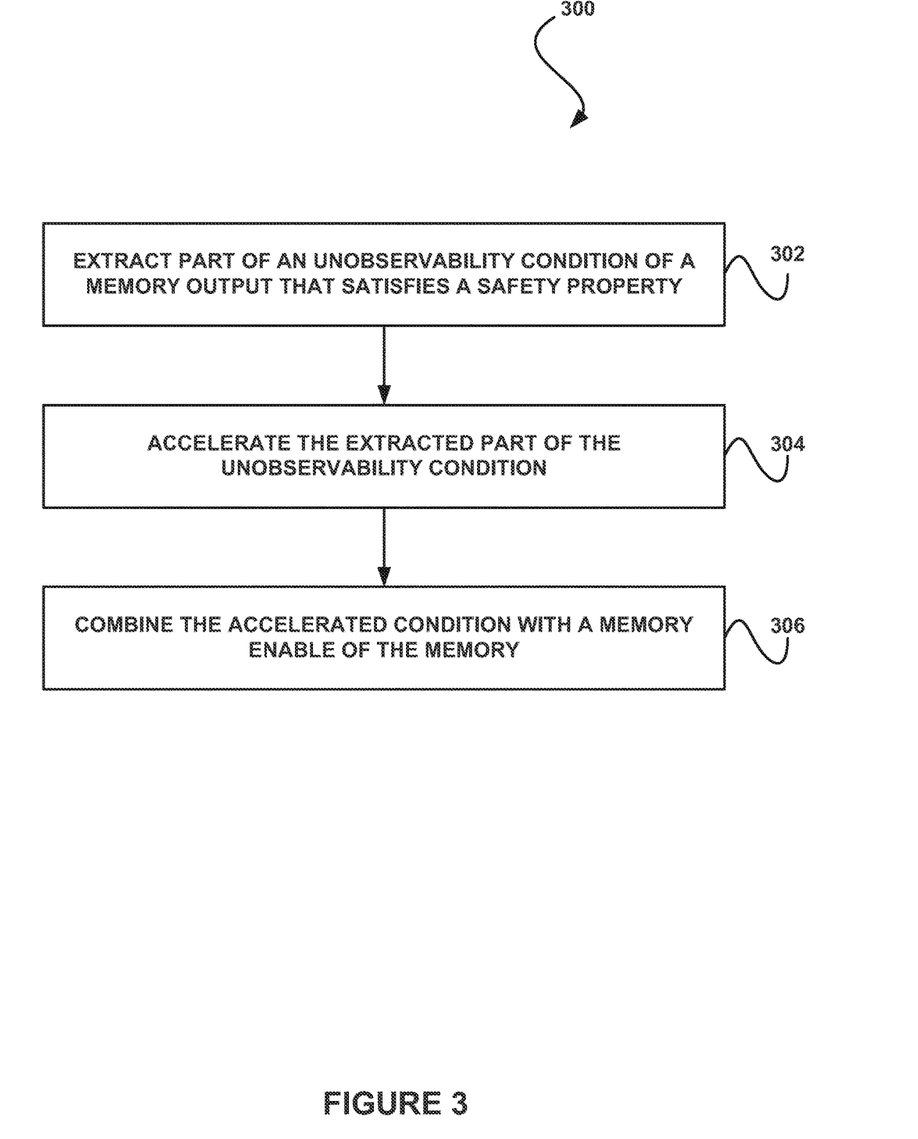
FIG. 3 shows a method for determining unobservable reads using a sequential observability analysis, in accordance with yet another embodiment.

FIG. 3 shows a method 300 for determining unobservable reads using a sequential observability analysis, in accordance with one embodiment. As an option, the method 300 may be carried out in the context of the details of FIGS. 1 and/or 2. Of course, however, the method 300 may be carried out in any desired environment. Further, the aforementioned definitions may equally apply to the description below.

As shown in operation 302, a part of an unobservability condition of a memory output that satisfies a safety property is extracted from hardware logic. For example, the part of the unobservability condition of a memory output under which a first read can be eliminated completely without changing a functionality of a hardware logic design may be extracted from the hardware logic.

Additionally, as shown in operation 304, the extracted part of the unobservability condition is accelerated. For example, a value of a signal generated by the extracted part of the unobservability condition may be predicted one or more clock cycles in advance, from a time when a read enable is asserted. In one embodiment, the extracted part of the unobservability condition may be accelerated utilizing one or more techniques found in U.S. patent application Ser. No. 11/832,425, which is incorporated herein by reference in its entirety for all purposes. Of course, however, the extracted part of the unobservability condition may be accelerated in any manner.

Further, as shown in operation 306, the accelerated condition is combined with a memory enable of the memory. For example, given an accelerated condition C and old memory enable old_ME, such condition C may be combined with the old memory enable old_ME to generate a new, more optimal enable new_ME for the memory in question, as illustrated in Table 1. It should be noted that the memory enable presented in Table 1 is set forth for illustrative purposes only, and thus should not be construed as limiting in any manner.

TABLE 1

| new_ME = old _ME & (RW|(~C)) |
| --- |

As shown hereinabove in Table 1, RW represents a read-write signal on the memory. Additionally, there are two terms in the assignment expression. The second term (old_ME & (~C)) inhibits the memory enable when C is 1, and the first (old_ME & RW) ensures that the enable of the memory gets inhibited only when a read is being requested.

In this way, a condition that prevents an unobservable read may include a condition that does not allow a read to happen if a memory output remains unobservable from a clock cycle following a read request to a clock cycle when a subsequent read is requested. In one embodiment, this period may correspond to the time during which the results of the first read are held on the memory output. For example, the results of the first read may only be able to be observed during this period. Therefore, such a condition may satisfy the safety property, under which the first read can be eliminated completely without changing the functionality of the design.

In another embodiment, if a latency of the memory is greater than one (1), the unobservability condition at the memory output may have to be accelerated across (n–1) stages of flops, where n is the read latency. The results of such acceleration may include the unobservability condition for such memory.

Figure 4:
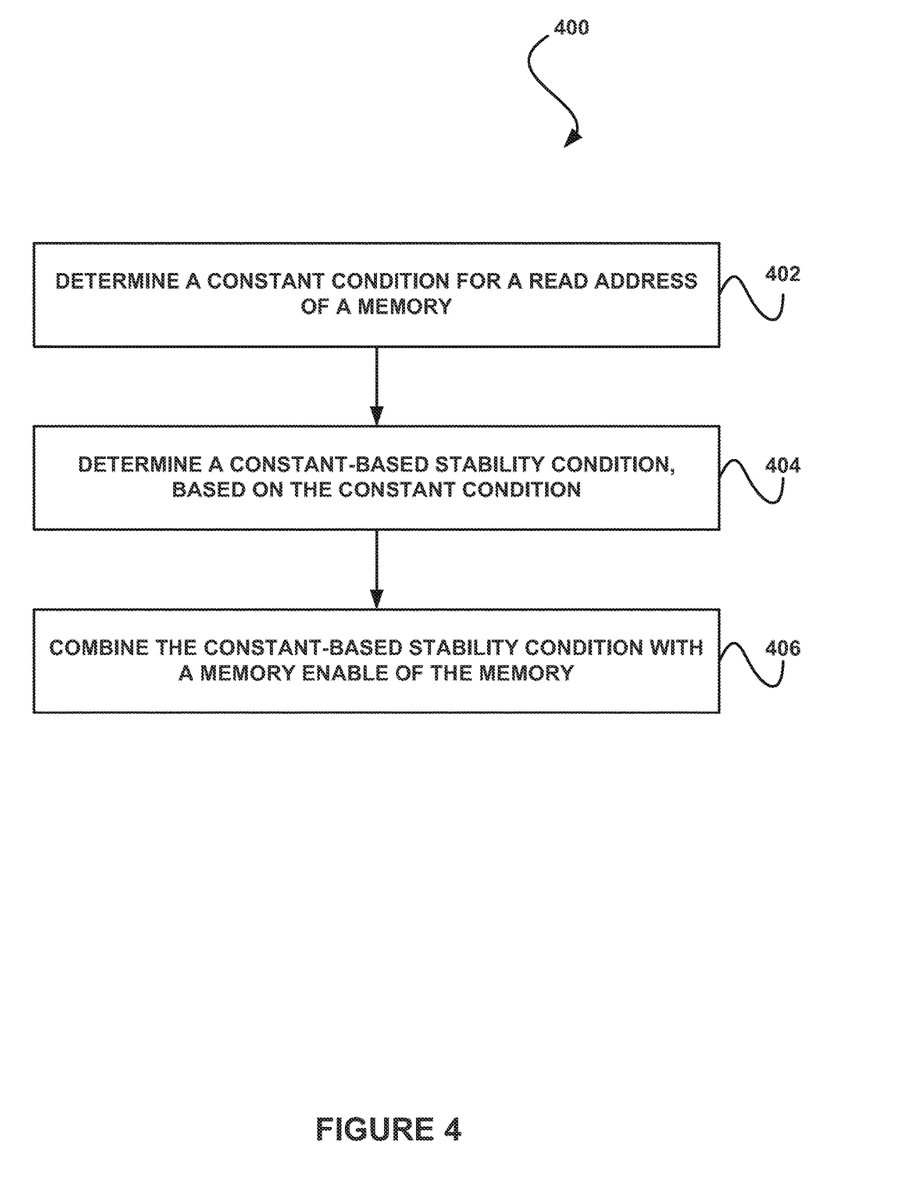
FIG. 4 shows a method for determining a stable read using a constant-based sequential stability analysis, in accordance with still another embodiment.

FIG. 4 shows a method 400 for determining a stable read using a constant-based sequential stability analysis, in accordance with one embodiment. As an option, the method 400 may be carried out in the context of the details of FIGS. 1-3. Of course, however, the method 400 may be carried out in any desired environment. Further, the aforementioned definitions may equally apply to the description below.

As shown in operation 402, a constant condition for a read address of a memory is determined. For example, a condition may be determined where a constant value (e.g., 0, etc.) is being fed to an address input of a memory. In one embodiment, a netlist (e.g., a netlist that drives address logic, etc.) may be examined in order to determine the constant condition. In another embodiment, the constant condition may include a condition where a default address is used.

Further, as shown in operation 404, a constant-based stability condition is determined, based on the constant condition. In one embodiment, the constant-based stability condition may return a particular value based on the constant condition. For example, the constant-based stability condition may evaluate to TRUE (1) if the constant condition indicates that a constant value is being applied to a particular read address of the memory for two or more subsequent reads.

Further still, as shown in operation 406, the constant-based stability condition is combined with a memory enable of the memory. In this way, a memory read request may not be allowed if the read address of the memory read request is the same as when the previous read request was made and no write to the same address has taken place since the previous read request. Additionally, if two successive read requests for the same address happen, and there is no write to the address in the period between the two read requests, the results from the previous read may therefore be re-used, and a current read may be eliminated as a redundant access.

For example, Table 2 illustrates an exemplary embodiment for determining a stable read using a constant-based sequential stability analysis. It should be noted that the embodiment presented in Table 2 is set forth for illustrative purposes only, and thus should not be construed as limiting in any manner. Additionally, although the embodiment presented in Table 2 is illustrated using Verilog hardware description language (HDL), it should be noted that any HDL or other code may be used in association with such an embodiment.

TABLE 2

```
wire C_stable, Cflop_in;
reg Cflop;
// C_stable is the condition that the results of the current read are already available
```

TABLE 2-continued

```
// at the memory output
assign C_stable = Cflop & Cflop_in;
// Cflop_in is the condition that a read is being requested and the address is a
// particular constant value
assign Cflop_in = CC & !RW & ME;
// Cflop captures the condition that the previous read was to a particular
constant address
// i.e. if Cflop is 1, the previous read happened to the particular address.
Cflop needs to be
//cleared to 0 if a write happens, set to 1 if a read happens to the particular
address and set
//to 0 if a read happens to some other address.
always@(posedge clk or posedge reset)
   if( reset )
      Cflop <= 0;
   else if( ME )
      Cflop <= Cflop_in;
```

As shown above in Table 2, a condition is determined under which the read address is a particular constant value. If such a constant condition (CC) for the read address is discovered, a constant-based stability condition that detects a stable read is described as C_stable. In one embodiment, C_stable, which represents the condition that the results of the current read are already available at the memory output, may be combined with the memory enable of the memory. In this way, unnecessary second reads may be completely eliminated without changing the functionality of the design of the hardware logic. Additionally, the constant-based sequential stability analysis may be unaffected by a read latency of the memory.

Figure 5:
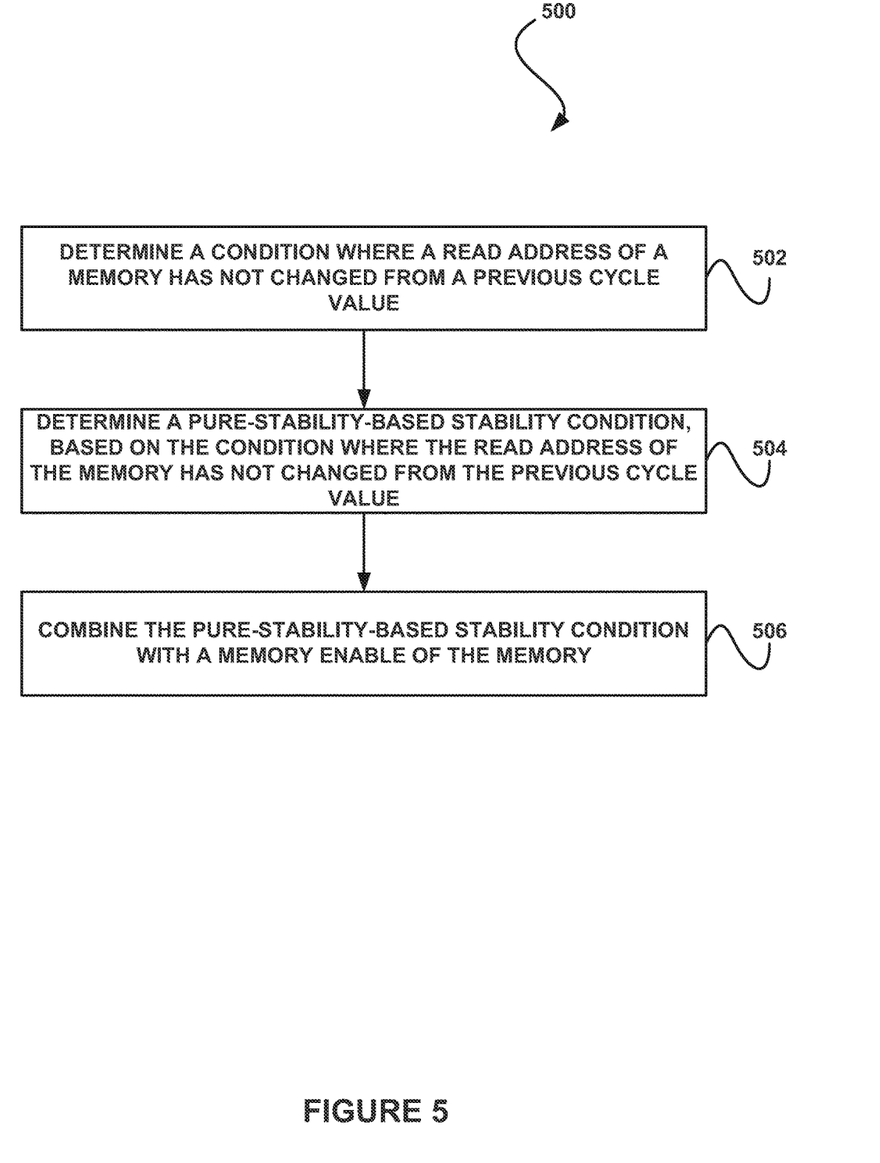
FIG. 5 shows a method for determining a stable read using a pure-stability-based sequential stability analysis, in accordance with still another embodiment.

FIG. 5 shows a method 500 for determining a stable read using a pure-stability-based sequential stability analysis, in accordance with one embodiment. As an option, the method 500 may be carried out in the context of the details of FIGS. 1-4. Of course, however, the method 500 may be carried out in any desired environment. Further, the aforementioned definitions may equally apply to the description below.

As shown in operation 502, a condition is determined where a read address of a memory has not changed from a previous cycle value. In one embodiment, the address of the memory itself may not be known, but it may be determined that a condition exists where a previous cycle address value is the same as a current cycle address value (i.e., the address is the same between two subsequent reads).

Additionally, as shown in operation 504, a pure-stability-based stability condition is determined, based on the condition where the read address of the memory has not changed from the previous cycle value. In one embodiment, the pure-stability-based stability condition may return a particular value based on the condition where the read address of the memory has not changed from the previous cycle value. For example, the pure-stability-based stability condition may evaluate to TRUE (1) when the read address of the memory has not changed from the previous cycle value and there is no write to memory in the current cycle.

Further, as shown in operation 506, the pure-stability-based stability condition is combined with a memory enable of the memory. In this way, a memory read request may not be allowed if a previous cycle address value is the same as a current cycle address value and there is no write to memory in the current cycle. Therefore, the result of a previous read may be re-used, and a current read may be eliminated as a redundant access.

For example, Table 3 illustrates an exemplary embodiment for determining a stable read using a pure-stabilitybased sequential stability analysis. It should be noted that the embodiment presented in Table 3 is set forth for illustrative purposes only, and thus should not be construed as limiting in any manner. Additionally, although the embodiment presented in Table 3 is illustrated using Verilog hardware description language (HDL), it should be noted that any HDL or other code may be used in association with such an embodiment.

TABLE 3

```
wire S_stable, SS_with_no_write, read_enable;
reg Sflop;
// S_stable is the condition that the results of the current read are already available
// at the memory output
assign S_stable = Sflop & SS_with_no_write;
// SS is the condition that the previous cycle address value is the same as the
// current cycle address value (how to obtain such are conditions is discussed in
// the patent on stability analysis). SS_with_no_write restricts SS to those
// conditions where the previous cycle address value is the same as the current one
// and there is no write to memory in the current cycle.
assign SS_with_no_write = SS & (!ME | !RW );
assign read_enable = ME & !RW;
// Sflop captures the stability of the read results at the memory's output with respect
// to the previous read. If the address changes or there is a write to the memory,
// Sflop is cleared to 0, unless there is a fresh read (for which a new cycle of
// stability accounting starts).
always @(posedge clk or posedge reset)
   if( reset )
     Sflop <= 0;
   else if (!S_stable)
      Sflop <= read_enable;
```

As shown above in Table 3, a condition is determined under which the read address has not changed from its previous cycle value. If such a condition (SS) is discovered, a condition to detect a stable read is described as S_stable. In one embodiment, S_stable, which represents the condition that the results of the current read are already available at the memory output, may be combined with the memory enable of the memory. In this way, unnecessary second reads may be completely eliminated without changing the functionality of the design of the hardware logic. Also, the pure-stability-based sequential stability analysis may be unaffected by a read latency of the memory.

Additionally, in one embodiment, if a stable read is being determined for a multi-port or one-read-one-write memory using a pure-stability-based sequential stability analysis, a captured stability condition may be discarded (e.g., using Sflop, etc.) when any write happens to the memory (e.g., through any port). Additionally, the correct read_enable may be used in the final description of S_stable.

Figure 6:
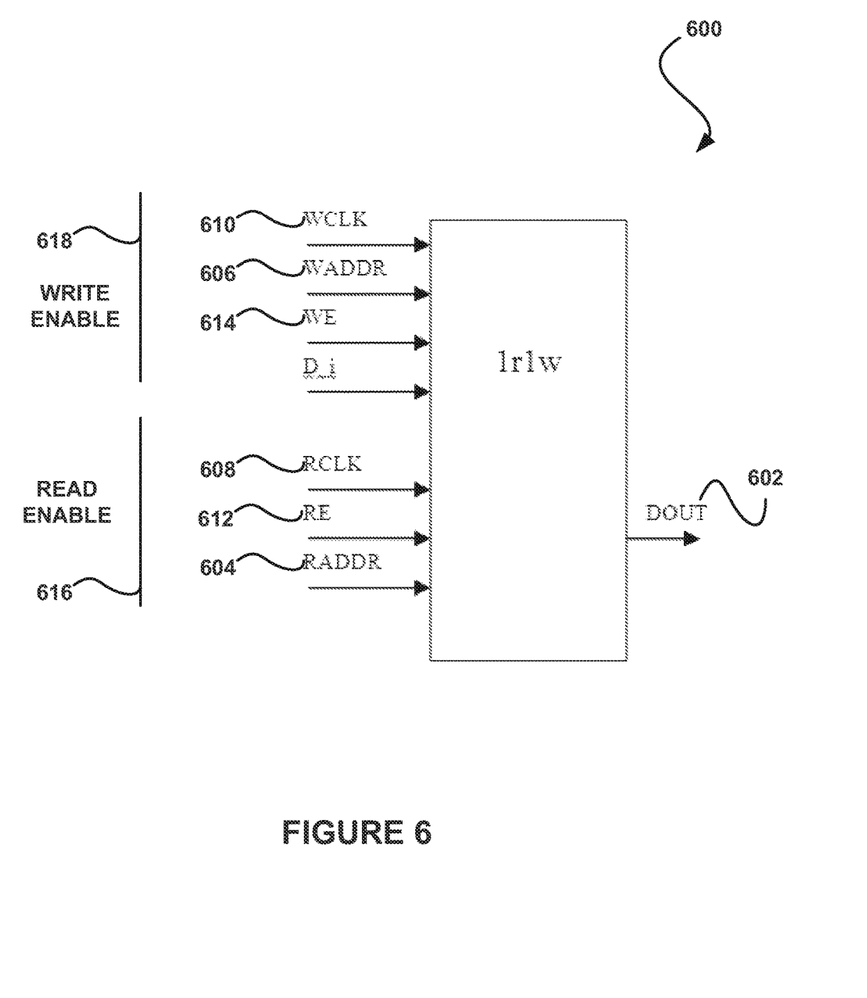
FIG. 6 shows an exemplary one-read one-write (1r1w) memory, in accordance with still another embodiment.

FIG. 6 shows an exemplary one-read one-write (1r1w) memory 600, in accordance with one embodiment. As an option, the memory 600 may be utilized in the context of the details of FIGS. 1-5. Of course, however, the memory 600 may be utilized in any desired environment. Further, the aforementioned definitions may equally apply to the description below.

As shown, the 1r1w memory 600 includes an output 602. Instead of a single address input found in a single-port memory, the 1r1w memory 600 includes a read address input 604 and a write address input 606. Likewise, instead of a single clock input found in a single-port memory, the 1r1w memory 600 includes a read clock input 608 and a write clock input 610. Further, instead of a single memory enable input found in a single-port memory, the 1r1w memory 600 includes a read enable input 612 and a write enable input 614. In this way, the 1r1w memory 600 includes a dedicated read port 616 and a dedicated write port 618.

In one embodiment, in order to determine unobservable reads using a sequential observability analysis for the 1r1w memory 600, an accelerated condition may be combined with the read enable input 612 of the memory 600. For example, given an accelerated condition C and old enable of the read port old_RE, such condition C may be combined with the old read enable old_RE to generate a new, more optimal read enable new_RE for the memory 600, as illustrated in Table 4. It should be noted that the memory enable presented in Table 4 is set forth for illustrative purposes only, and thus should not be construed as limiting in any manner.

TABLE 4 new_RE = old_RE & (~C))

Additionally, in another embodiment, in order to perform constant-based sequential stability analysis for the 1r1w memory 600, a write on the write enable input 614 must be explicitly checked for, unlike a single-port memory, where reads and writes are mutually exclusive. For example, Table 5 illustrates an exemplary embodiment for performing a constant-based sequential stability analysis for the 1r1w memory 600. It should be noted that the embodiment presented in Table 5 is set forth for illustrative purposes only, and thus should not be construed as limiting in any manner. Additionally, although the embodiment presented in Table 5 is illustrated using Verilog hardware description language (HDL), it should be noted that any HDL or other code may be used in association with such an embodiment.

TABLE 5

```
wire C_stable, Cflop_in;
reg Cflop;
assign C_stable = Cflop & Cflop_in;
assign Cflop_in = CC & RE & !WE; // Note that a write must be explicitly
                                 checked for
                                 // unlike the 1-p memory case,
                                 where reads
                                 // and writes are mutually exclusive
always@(posedge elk or posedge reset)
   if( reset )
     Cflop <= 0;
   else if( RE | WE ) // ME in the 1-p case gets replaced by RE | WE (the
                        condition for
                        // an access happening in the 1r1w case)
     Cflop <= Cflop_in; .
```

In this way, the separate read enable input 612 and write enable input 614 of the 1r1w memory 600 may be accounted for during constant-based sequential stability analysis.

Figure 7:
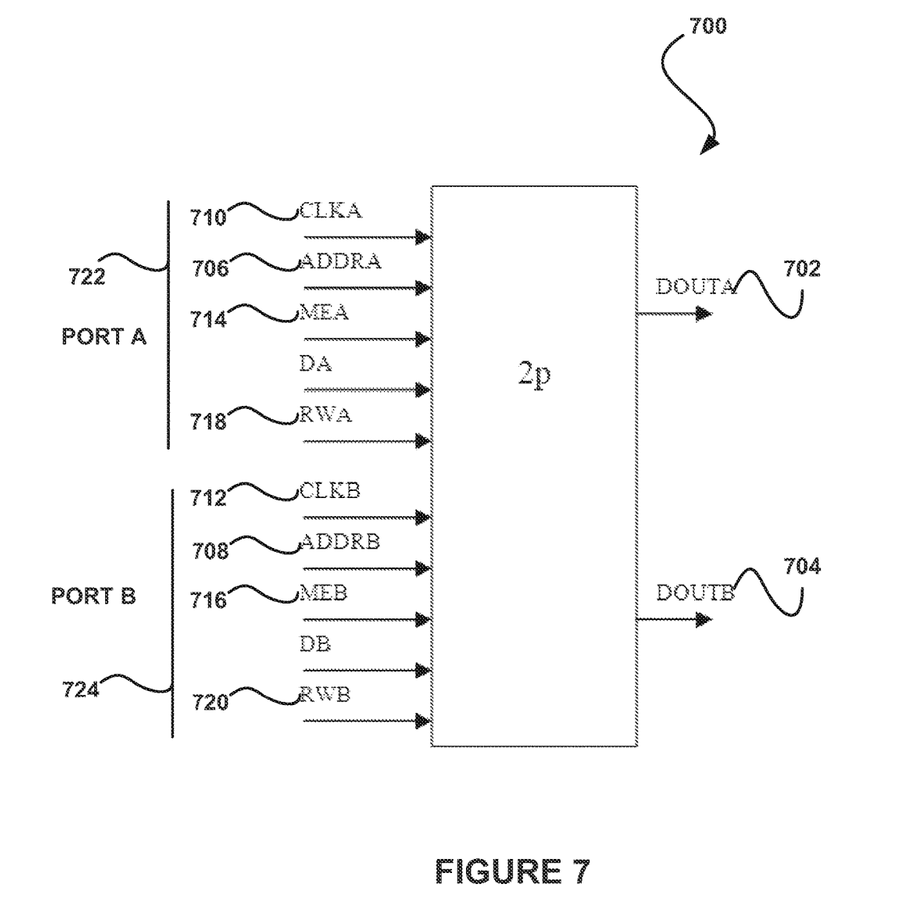
FIG. 7 shows an exemplary two-port (2p) memory, in accordance with still another embodiment.

FIG. 7 shows an exemplary two-port (2p) memory 700, in accordance with one embodiment. As an option, the memory 700 may be utilized in the context of the details of FIGS. 1-6. Of course, however, the memory 700 may be utilized in any desired environment. Further, the aforementioned definitions may equally apply to the description below.

As shown, the 2p memory 700 includes two ports, port A 722 and port B 724, and includes two respective outputs, an output 702 for port A 722 and an output 704 for port B 724. Instead of a single address input found in a single-port memory, the 2p memory 700 includes an address input 706 for port A 722 and an address input 708 for port B 724.

Likewise, instead of a single clock input found in a single-port memory, the 2p memory includes a clock input 710 for port A 722 and clock input 712 for port B 724. Further, instead of a single memory enable input found in a single-port memory, the 2p memory includes a memory enable input 714 for port A 722 and a memory enable input 716 for port B 724. Further still, instead of a read/write input found in a single-port memory, the 2p memory 700 includes a read/write input 718 for port A 722 and a read/write input 720 for port B 724. In this way, port A 722 and port B 724 the 2p memory 700 both include complete read and write functionality.

In one embodiment, in order to determine unobservable reads using a sequential observability analysis for the 2p memory 700, an accelerated condition for port A 722 and port B 724 may be combined with the memory enable input for the respective port. For example, given an accelerated condition C and old memory enable old_ME, such condition C may be combined with the old memory enable old_ME to generate a new, more optimal enable new_ME for port A 722 and port B 724 of memory 700, as illustrated in Table 6. It should be noted that the memory enable presented in Table 6 is set forth for illustrative purposes only, and thus should not be construed as limiting in any manner.

TABLE 6 new_MEA = old_MEA & (RWA|(~C))
new_MEB = old_MEB & (RWB|(~C))

In one embodiment, since 2p memory 700 has two ports, there are potentially two reads that may happen at the same time (e.g., one read at port A 722 and one read at port B 724). Therefore, as shown in Table 6, each of the two reads may then become a separate candidate for optimization using a sequential observability analysis.

Additionally, in another embodiment, in order to perform constant-based sequential stability analysis for the 2p memory 700, writes to port A 722 as well as port B 724 must be explicitly checked for. For example, Table 7 illustrates an exemplary embodiment for performing a constant-based sequential stability analysis for the part A 722 of 2p memory 700. It should be noted that the embodiment presented in Table 7 is set forth for illustrative purposes only, and thus should not be construed as limiting in any manner. Additionally, although the embodiment presented in Table 7 is illustrated using Verilog hardware description language (HDL), it should be noted that any HDL or other code may be used in association with such an embodiment.

TABLE 7

```
wire C_stable, Cflop_in;
reg Cflop;
assign C_stable = Cflop & Cflop_in;
assign Cflop_in = CC & MEA & (!RWA) & !(MEB & RWB);
    // Note that the condition now accounts for not just a read
    to a particular address
    // happening to port A, but that there should be no write to port B
always@(posedge clk or posedge reset)
    if( reset)
        Cflop <= 0;
    else if( MEA | (MEB & RWB) ) // Again, we must account
                                 for writes to port B
                                 // for correct type C optimization on
                                 port A
        Cflop <= Cflop_in;
```

In one embodiment, embodiment symmetric to that presented in Table 7 may be used for performing a constant-based sequential stability analysis for the part B 724 of 2p memory 700.

Figure 8:
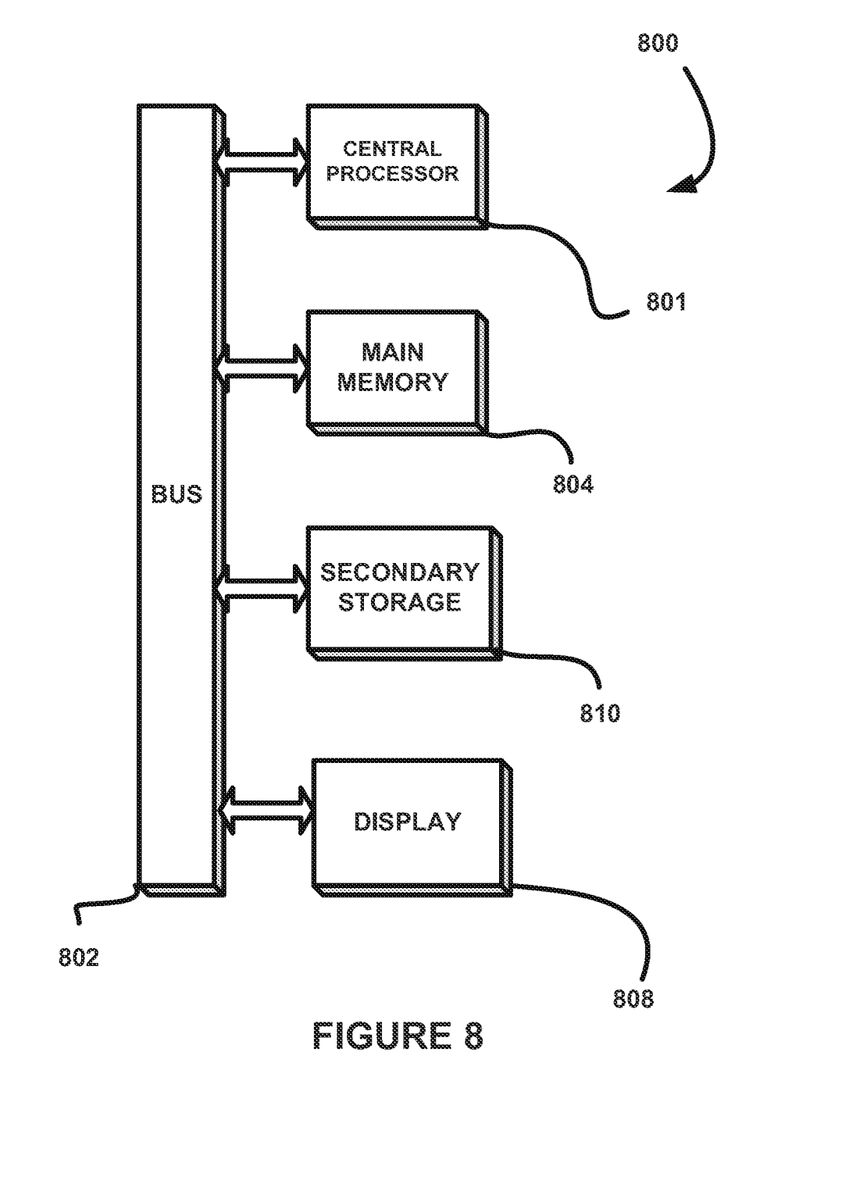
FIG. 8 illustrates an exemplary system, in accordance with one embodiment.

FIG. 8 illustrates an exemplary system 800 with which the various features of FIGS. 1-7 may be implemented, in accordance with one embodiment. Of course, the system 800 may be implemented in any desired environment.

As shown, a system 800 is provided including at least one central processor 801 which is connected to a communication bus 802. The system 800 also includes main memory 804 [e.g. random access memory (RAM), etc.]. The system 800 also includes a display 808.

The system 800 may also include a secondary storage 810. The secondary storage 810 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 804 and/or the secondary storage 810. Such computer programs, when executed, enable the system 800 to perform various functions. Memory 804, storage 810 and/or any other storage are possible examples of computer-readable media.

In one embodiment, such computer programs may be used to carry out the functionality of the previous figures. Further, in other embodiments, the architecture and/or functionality of the various previous figures may be implemented utilizing the host processor 801, a chipset (i.e. a group of integrated circuits designed to work and sold as a unit for performing related functions, etc.), and/or any other integrated circuit for that matter.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer program product embodied on a non-transitory computer readable medium, comprising:
    computer code for identifying a memory read request;
    computer code for determining whether the memory read request is an unnecessary memory read request because one or more results of the memory read request are not utilized within a predetermined period, thus allowing the memory read request to be eliminated without changing functionality of a hardware logic design; and
    computer code for eliminating the memory read request, based on the determination, wherein eliminating the memory read request comprises preventing the memory read request from being executed.

2. The computer program product of claim 1, wherein the memory read request is determined to be the unnecessary memory read request if an output of the memory remains unobservable from a clock cycle following the memory read request to a clock cycle of a subsequent read request.

3. The computer program product of claim 1, wherein the computer program product is operable such that the memory read request is eliminated if it is determined that the memory read request is an unnecessary memory read request.

4. The computer program product of claim 3, wherein the memory read request is eliminated by adding a condition that prevents the memory read request.

5. The computer program product of claim 1, wherein determining whether the memory read request is the unnecessary memory read request includes extracting a condition of an output of the memory.

6. The computer program product of claim 5, wherein determining whether the memory read request is the unnecessary memory read request further includes accelerating the extracted condition.

7. The computer program product of claim 6, wherein eliminating the memory read request includes combining the accelerated condition with a memory enable of the memory.

8. A method, comprising:
with a computer processor:
identifying a memory read request from hardware logic;
determining whether the memory read request is unobservable to the hardware logic because one or more results of the memory read request are not utilized within a predetermined period, thus allowing the memory read request to be eliminated without changing functionality of the hardware logic; and
eliminating the memory read request, based on the determination, wherein eliminating the memory read request comprises preventing the memory read request from being executed.

9. The method of claim 8, wherein the memory read request is eliminated if it is determined that the memory read request is an unnecessary memory read request.

10. The method of claim 8, wherein the memory read request is determined to be the unnecessary memory read request if an output of the memory remains unobservable from a clock cycle following the memory read request to a clock cycle of a subsequent read request.

11. The method of claim 8, wherein determining whether the memory read request is the unnecessary memory read request includes extracting a condition of an output of the memory.

12. The method of claim 11, wherein determining whether the memory read request is the unnecessary memory read request further includes accelerating the extracted condition.

13. The method of claim 12, wherein eliminating the memory read request includes combining the accelerated condition with a memory enable of the memory.

14. A system, comprising:
a computer comprising one or more processors and a memory, wherein the memory comprises executable instructions that, when executed by the one or more processors, cause the computer to perform operations, the operations comprising:
identify a memory read request from hardware logic;
determine whether the memory read request is unobservable to the hardware logic because one or more results of the memory read request are not utilized within a predetermined period, thus allowing the memory read request to be eliminated without changing functionality of the hardware logic; and
eliminate the memory read request, based on the determination, comprising preventing the memory read request from being executed.

15. The system of claim 14, wherein the memory read request is eliminated if it is determined that the memory read request is an unnecessary memory read request.

16. The system of claim 14, wherein the memory read request is eliminated by adding a condition that prevents the memory read request.

17. The system of claim 14, wherein the memory read request is determined to be the unnecessary memory read request if an output of the memory remains unobservable from a clock cycle following the memory read request to a clock cycle of a subsequent read request.

18. The computer program product of claim 14, wherein determining whether the memory read request is the unnecessary memory read request includes extracting a condition of an output of the memory.

19. The system of claim 18, wherein determining whether the memory read request is the unnecessary memory read request further includes accelerating the extracted condition.

20. The system of claim 19, wherein eliminating the memory read request includes combining the accelerated condition with a memory enable of the memory.

* * * * *